United States Patent
Akimoto et al.

[11] Patent Number: 5,923,915
[45] Date of Patent: Jul. 13, 1999

[54] METHOD AND APPARATUS FOR PROCESSING RESIST

[75] Inventors: Masami Akimoto, Kumamoto; Yoichi Deguchi, Machida, both of Japan

[73] Assignee: Tokyo Electron Limited, Tokyo, Japan

[21] Appl. No.: 08/962,548

[22] Filed: Oct. 31, 1997

[30] Foreign Application Priority Data

Nov. 11, 1996 [JP] Japan ................................. 8-312659

[51] Int. Cl.$^6$ ..................................................... G03D 5/00
[52] U.S. Cl. .......................... 396/604; 396/611; 118/52; 355/53; 356/400; 414/225
[58] Field of Search ...................... 396/568, 570, 396/604, 611, 642, 647; 118/52; 356/399–401; 414/225, 217, 414, 416, 783, 936, 937

[56] References Cited

U.S. PATENT DOCUMENTS

| | | | |
|---|---|---|---|
| 5,054,991 | 10/1991 | Kato ........................................ | 414/783 |
| 5,102,280 | 4/1992 | Poduje et al. .......................... | 414/225 |
| 5,405,230 | 4/1995 | Ono et al. .............................. | 414/225 |
| 5,664,254 | 9/1997 | Ohkura et al. ......................... | 396/611 |
| 5,688,322 | 11/1997 | Motoda et al. ......................... | 118/52 |
| 5,700,127 | 12/1997 | Harada et al. ......................... | 414/416 |

Primary Examiner—D. Rutledge
Attorney, Agent, or Firm—Oblon, Spivak, McClelland, Maier & Neustadt, P.C.

[57] ABSTRACT

A resist processing method in which a substrate is successively transferred by an arm mechanism into a plurality of process units for successively processing the substrate, comprising the steps of (a) loading a substrate having a reference region which is aligned as desired relative to the process unit and the arm mechanism in a horizontal plane, into the process unit, the substrate being held substantially horizontal by a spin chuck surrounded by a drain cup, (b) rotating the spin chuck holding the substrate and supplying a process solution onto the substrate rotated together with the spin chuck, (c) stopping the supply of the process solution and also stopping rotation of the substrate, (d) detecting a position of the reference region in the horizontal plane of the substrate held on the spin chuck, (e) rotating the substrate together with the spin chuck based on the position detected in the step (d) to permit the reference region of the substrate to be aligned with an initial position in the step (a) of loading the substrate into the process unit, and (f) unloading the substrate out of the process unit when the substrate is rotated to a position at which the reference region of the substrate is aligned with the initial position.

12 Claims, 7 Drawing Sheets

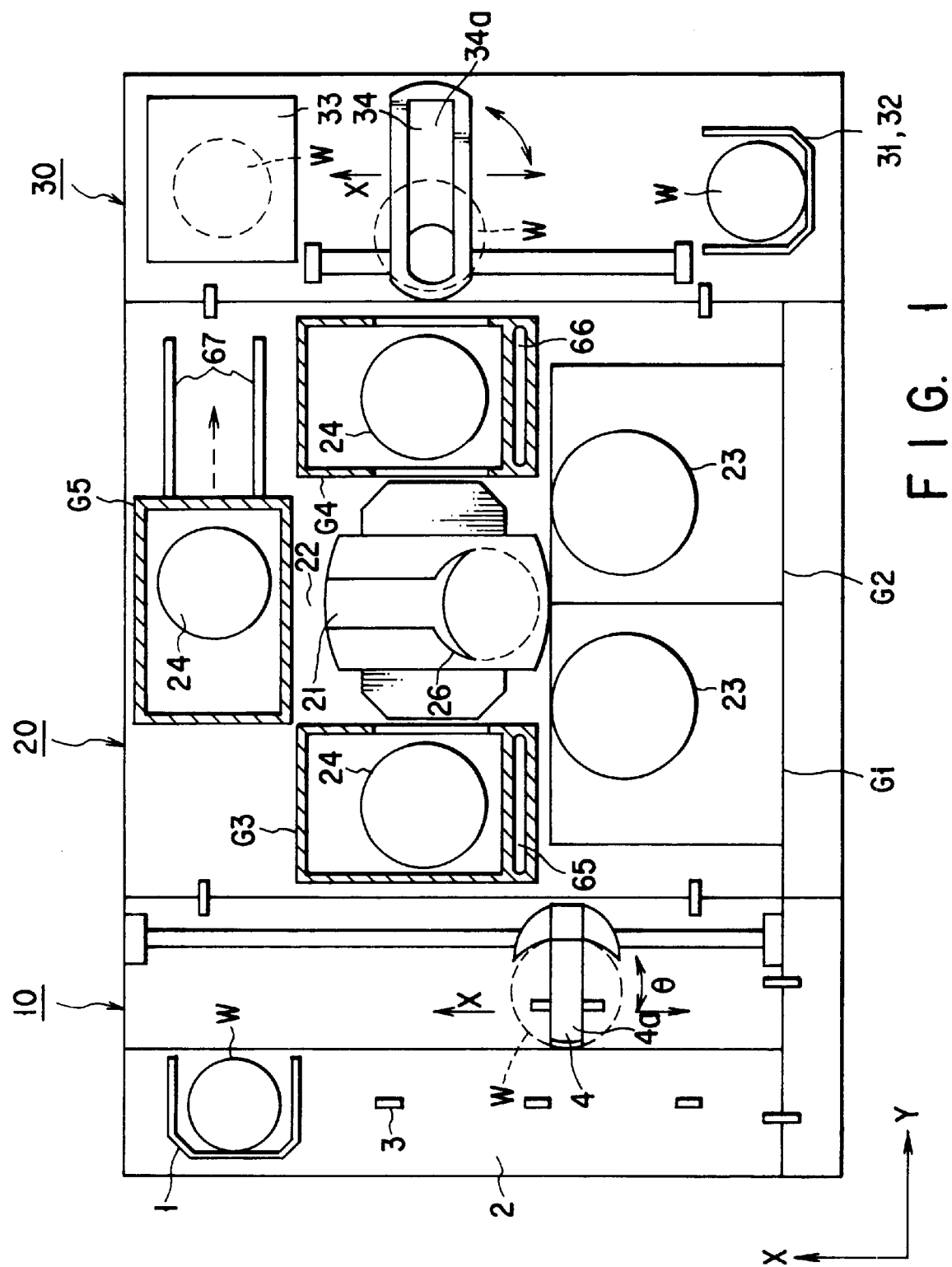
F I G. 1

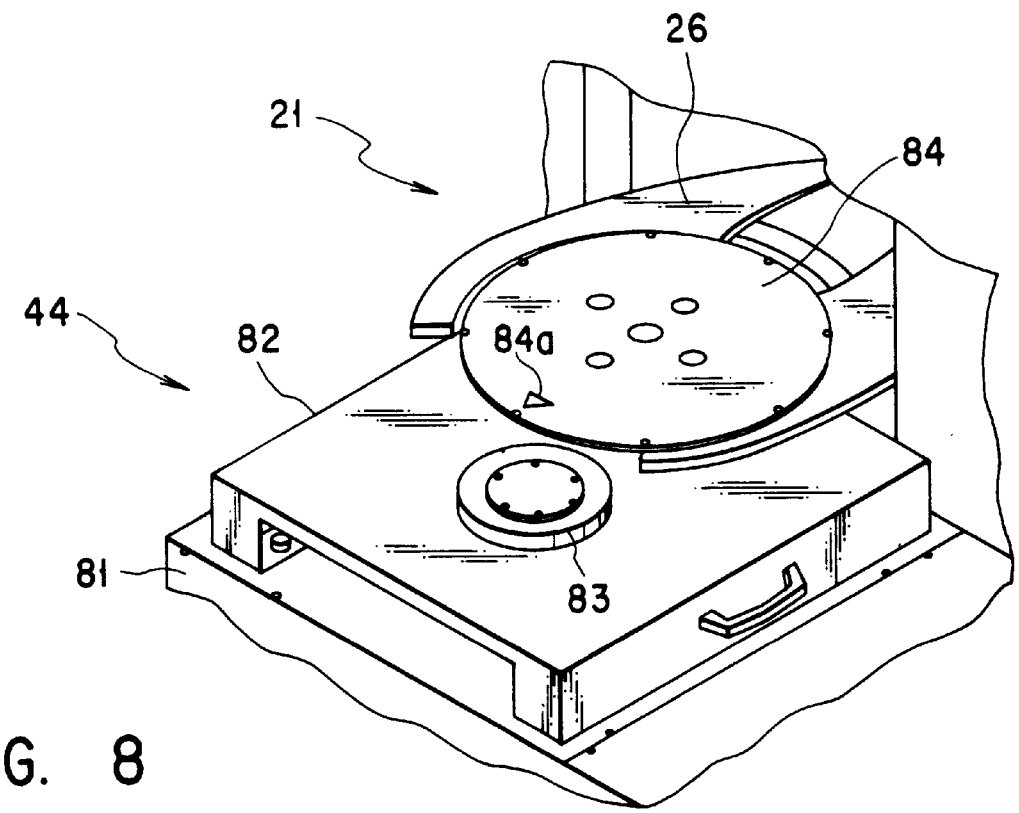
F I G. 8
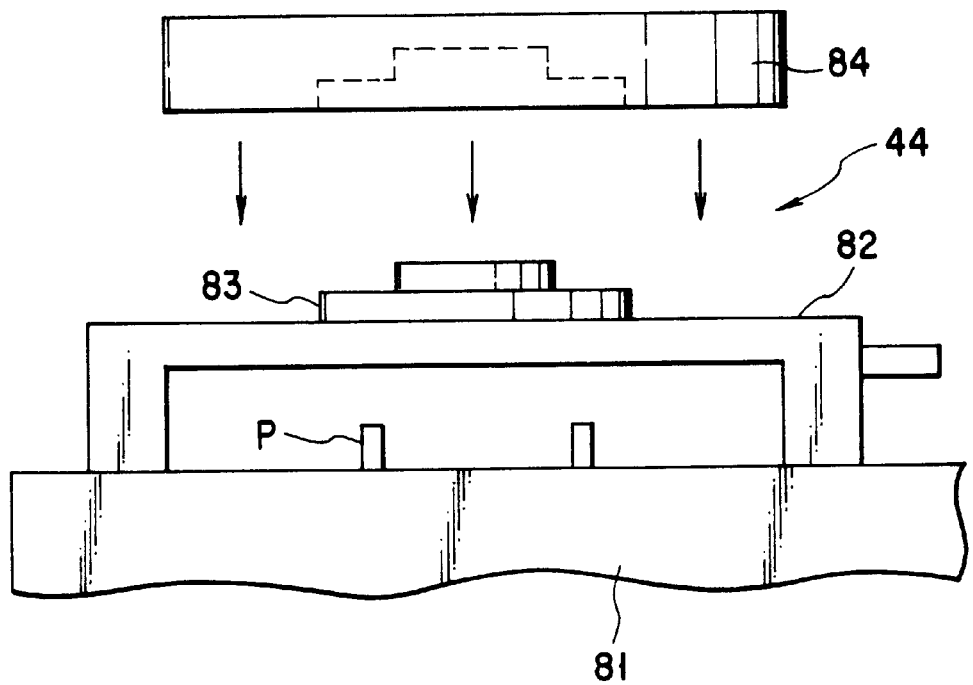
F I G. 9

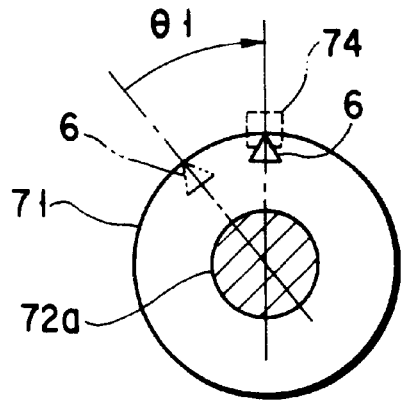
F I G. 11
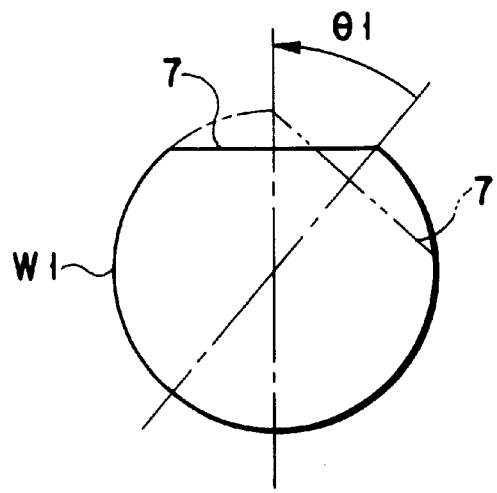
F I G. 12
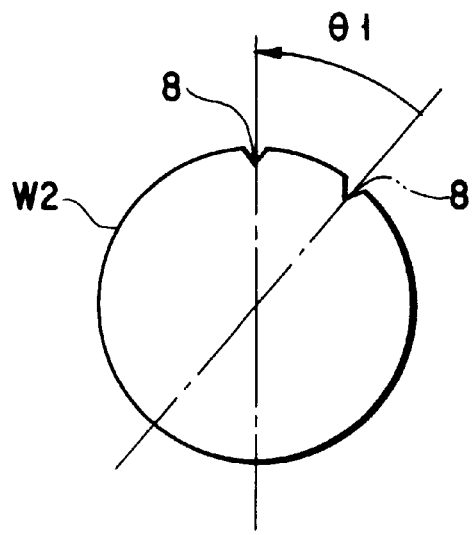
F I G. 13

METHOD AND APPARATUS FOR PROCESSING RESIST

BACKGROUND OF THE INVENTION

The present invention relates to a method and apparatus for coating a substrate such as a semiconductor wafer or an LCD (liquid crystal display) substrate with resist, followed by developing the resist coating.

Used in a photolithography process is a resist processing system in which semiconductor wafers are successively coated with a resist solution and, then, the resist coating is developed. Many process units are included in a process section of the resist processing system. For example, in the resist processing system disclosed in U.S. patent application Ser. No. 08/667,712, U.S. Pat. No. 5,700,127 many process units are arranged on both sides of a horizontal transfer path, and a wafer is transferred by a main arm mechanism along the horizontal transfer path into each process unit for a desired processing. Also, in the resist processing system disclosed in U.S. Pat. No. 5,664,254, many process units are arranged around a vertical transfer path, and a wafer is transferred by a main arm mechanism along the vertical transfer path into each process unit for a desired processing.

For processing a wafer accurately and with safety within each process unit, the wafer must be positioned with high accuracy within the process unit. It was customary in the prior art to introduce a wafer, which is transferred from a cassette section into a process section, into an alignment unit for adjusting the wafer position relative to the process unit within the process section. Also, every time the position of a wafer taken out of a process unit is deviated from the position in the step of transfer into the process unit, the wafer is transferred into the alignment unit to adjust the wafer position as desired relative to the next process unit. Particularly, in the resist coating or developing unit in which the wafer is revolved about its own axis during the processing, the horizontal position of the orientation flat of the wafer taken out of the process unit differs from that in the step of transfer into the process unit. Therefore, the wafer must be transferred to the alignment unit for adjusting the horizontal position of the orientation flat every time the wafer is taken out of the particular process unit. In this fashion, the main arm mechanism must be moved for simply adjusting the wafer position. It follows that a load given to the main arm mechanism is increased. In addition, the wafer transfer time is increased, leading to a low through-put and an increased danger of particle adhesion to the wafer.

In the resist coating unit, the inner surface of a drain cup is periodically washed using an exclusive washing tool containing a solvent such as a thinner in order to remove the resist attached to the inner surface of the cup. In washing the cup, the washing tool housed somewhere in the system is transferred to the resist coating unit so as to be mounted to a spin chuck. When the washing tool mounted to the spin chuck is rotated, the solvent is spurted through holes made in the circumferential wall of the tool toward the inner surface of the drain cup so as to dissolve the resist attached to the inner surface of the cup. After the washing, the washing tool is detached from the spin chuck and is brought back to the original housing region. It should be noted that, if the washing tool fails to be brought back accurately to the original position, the washing tool cannot be mounted to the spin chuck when the drain cup is washed again. To overcome this difficulty, the washing tool is transferred to the alignment unit after the washing operation for positioning the washing tool as desired. Then, the washing tool is brought back to the original housing region. The requirement of transferring the washing tool to the alignment unit naturally causes the through-put to be lowered.

BRIEF SUMMARY OF THE INVENTION

An object of the present invention is to provide a method and apparatus for resist processing, in which a substrate after the resist coating or developing step during which the substrate is revolved about its own axis need not be transferred to another place for adjusting its position.

Another object is to provide a method and apparatus for resist processing, in which a washing tool for washing a drain cup need not be transferred after the washing operation to another place for adjusting its position.

According to a first aspect of the present invention, there is provided a resist processing method in which a substrate is successively transferred by an arm mechanism into a plurality of process units for successively processing the substrate, comprising the steps of (a) loading a substrate having a reference region which is aligned as desired relative to the process unit and the arm mechanism in a horizontal plane, into the process unit, the substrate being held substantially horizontal by a spin chuck surrounded by a drain cup, (b) rotating the spin chuck holding the substrate and supplying a process solution onto the substrate rotated together with the spin chuck, (c) stopping the supply of the process solution and also stopping rotation of the substrate, (d) detecting a position of the reference region in the horizontal plane of the substrate held on the spin chuck, (e) rotating the substrate together with the spin chuck based on the position detected in the step (d) to permit the reference region of the substrate to be aligned with an initial position in the step (a) of loading the substrate into the process unit, and (f) unloading the substrate out of the process unit when the substrate is rotated to a position at which the reference region of the substrate is aligned with the initial position.

It is desirable for the method of the present invention to comprise after the step (f) additional steps of (g) mounting a washing tool having a reference region which is aligned as desired relative to the process unit and the arm mechanism in the horizontal plane, onto the spin chuck, (h) rotating the washing tool together with the spin chuck and supplying a solvent to the rotating washing tool to permit the solvent to be centrifugally separated from the washing tool and to strike an inner surface of the drain cup, thereby dissolving an object adhered to the inner wall in the solvent so as to remove the adhered object, (i) stopping supply of the solvent and also stopping rotation of the washing tool, (j) detecting a position of the reference region of the stopped washing tool held on the spin chuck, (k) rotating the washing tool together with the spin chuck to permit the reference region of the washing tool to be aligned to an initial position in the step (g), and (l) transferring the washing tool out of the process unit when the reference region of the washing tool is made aligned with the initial position.

It is also desirable in the method of the present invention that at least one of the number of rotations and the horizontal position of the reference region of the substrate be sequentially detected between the steps (b) to (d) noted above.

In the resist processing method of the present invention, a substrate having a reference region is transferred in a predetermined direction to a spin chuck. Also, a rotating means is controlled to permit the horizontal position of the reference region of the substrate taken out of the process unit to be equal to that in the step of transferring the substrate into the process unit, making it unnecessary to transfer the substrate taken out of the process unit into, for example, an aligning unit for adjusting the horizontal position of the reference region.

Further, the rotating means is controlled in response to a position signal supplied from a detecting means to permit the horizontal position of the reference region of the washing tool taken out of a process unit to be equal to the initial position in the step of transferring the washing tool into the process unit, making it unnecessary to transfer the washing tool after the washing operation into, for example, an aligning unit for adjusting its position.

According to another aspect of the present invention there is provided a resist processing apparatus, comprising a process chamber, a spin chuck having a reference region, and for holding a substrate having a reference region within the process chamber, rotating means for rotating the spin chuck, a nozzle for supplying a process solution onto the substrate held on the spin chuck, a drain cup surrounding the spin chuck and the substrate, an arm mechanism for loading the substrate into the process chamber at a constant direction and for unloading the substrate out of the process chamber at the constant direction, and control means for controlling the operation of the rotating means to permit the reference region of the substrate taken out of the process chamber to be aligned with that in the step of loading the substrate into the process chamber.

In the resist processing apparatus of the present invention, a washing tool is arranged outside a drain cup. Therefore, the apparatus is not enlarged. Also, a process solution is supplied from above a holding surface of a spin chuck. On the other hand, a washing solution is supplied from below the holding surface of the spin chuck. It follows that the process solution supply mechanism and the washing solution supply mechanism do not interfere with each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a plan view showing a resist processing system;

FIG. 8 is an oblique view showing the state of a washing tool when transferred from a washing tool holder;

FIG. 9 is a side view showing a chilling plate unit equipped with a washing tool holder;

FIG. 11 is a plan view as seen from below of a spin chuck;

FIG. 12 shows how the position of a semiconductor wafer having an orientation flat is adjusted; and FIG. 13 shows how the position of a semiconductor wafer having a notch is adjusted.

DETAILED DESCRIPTION OF THE INVENTION

Let us describe preferred embodiments of the present invention with reference to the accompanying drawings, covering cases where a series of resist processing is applied to a semiconductor wafer.

Figure 2:
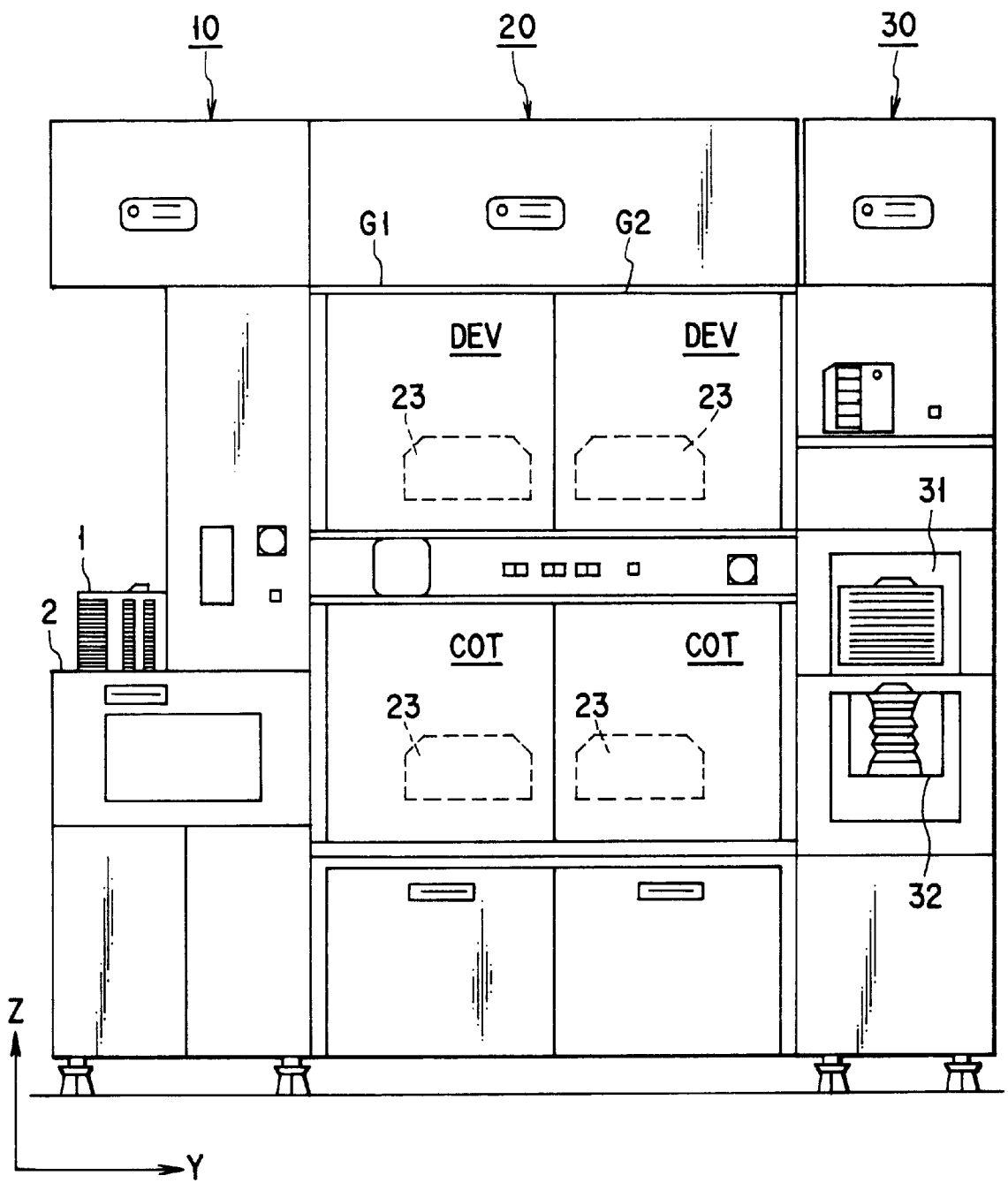
FIG. 2 is a side view showing the resist processing system of FIG. 1.
Figure 3:
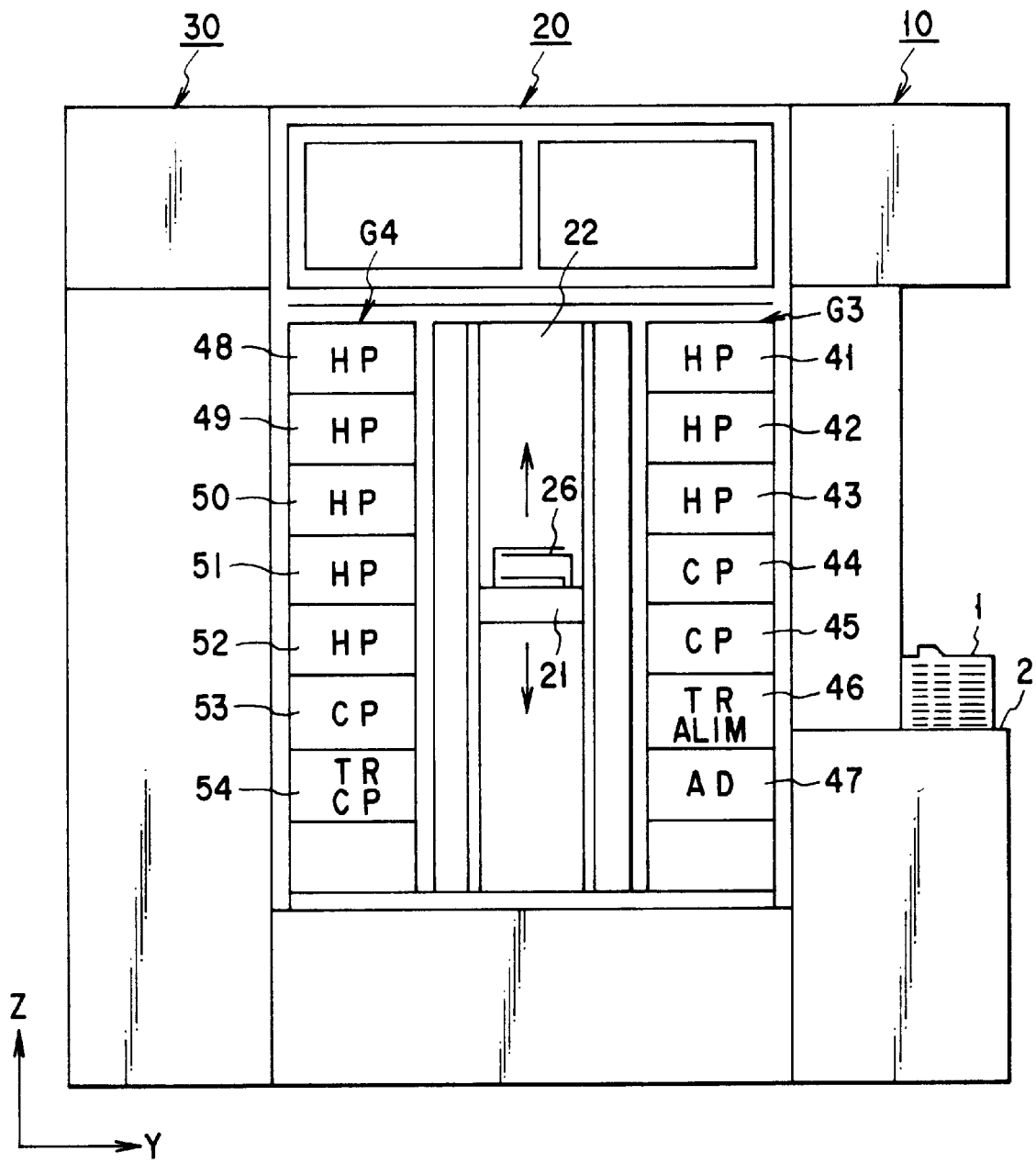
FIG. 3 is a back view showing the resist processing system of FIG. 1.

Specifically, FIGS. 1 to 3 collectively show a resist processing system comprising a cassette station 10, a process station 20, and an interface section 30. A cassette table 2, on which four cassettes 1 are disposed, and a first sub-arm mechanism 4 are arranged in the cassette station 10. The process station 20 includes five process unit groups G1 to G5, and a main arm mechanism 21. Further, the interface section 30, which is interposed between the process station 20 and a light-exposure apparatus (not shown), includes a second sub-arm mechanism 34 and a peripheral light-exposure apparatus 33.

The cassette 1 transferred by a transfer robot (not shown) from another system is received by the cassette station 10 and, then, transferred into the process station 20. Similarly, the cassette 1 is transferred from the cassette station 10 to the other system. A plurality of wafers W, e.g., 25 wafers W, are housed in each cassette 1.

As shown in FIG. 1, four projections 3 are formed on the table 2 in the cassette station 10 to permit the cassettes 1 to be positioned as desired in the cassette station 10. Each cassette 1 on the table 2 is positioned such that the opening for wafer transfer faces the process station 20. Wafers W are held horizontal a predetermined distance apart from each other within the cassette 1.

The first sub-arm mechanism 4 includes a holder 4a movable in an X-axis direction and a Z-axis direction. The wafer W is selectively taken out of any of the cassettes 1 by the holder 4a of the sub-arm mechanism 4. The holder 4a is supported swingable by an angle θ about the Z-axis. The wafer W is transferred between the first sub-arm mechanism 4 and a main arm mechanism 21 via a transfer/alignment unit (TR/ALIM) 46 included in a process unit group G3.

The process station 20 includes a plurality of process units 23 and 41 to 54 arranged to surround a transfer zone 22 and stacked one upon the other. A series of resist processing is applied to each wafer W in these process units, and the wafers are processed one by one in these process units.

As shown in FIG. 1, the main arm mechanism 21 is formed in the central transfer zone 22 of the process station 20. A plurality of holders 26 for holding the wafer W are mounted to the main arm mechanism 21. These holders 26 are driven by a plurality of driving mechanisms (not shown) so as to be movable back and forth, movable in a Z-axis direction, and swingable by an angle θ about the Z-axis.

The process units in the process station 20 are divided into five process groups G1 to G5. The first and second process groups G1 and G2 are arranged side by side in a front portion of the system. The third process group G3 is positioned adjacent to the cassette station 10. The fourth process group G4 is positioned adjacent to the interface section 30. Further, the fifth process group G5 is positioned in a back portion of the system.

As shown in FIG. 2, the first process group G1 includes two spinner type process units (DEV) and (COT) stacked one upon the other. In the embodiment shown in the drawing, the developing unit (DEV) is stacked on the resist coating unit (COT). The second process group G2 also includes a resist coating unit (COT) and a developing unit (DEV) stacked on the coating unit (COT). It is desirable to shorten the passageway of the waste solution discharged from the resist coating unit (COT) because the waste resist solution is more difficult to be disposed of than the waste developing solution. Therefore, the resist coating unit (COT) is arranged below the developing unit (DEV). However, it is possible to arrange the resist coating unit (COT) above the developing unit (DEV), if necessary.

As shown in FIG. 3, seven open type process units 41 to 47 are stacked one upon the other to form the third process group G3. To be more specific, the third process group G3 includes an adhesion unit (AD) 47, a transfer/alignment unit (TR/ALIM) 46, two chilling plate units (CP) 45, 44, and three hot plate units (HP) 43, 42, 41, which are stacked one upon the other in the order mention such that the adhesion unit (AD) 47 occupies the lowermost position. A cassette table 24 is included in each of these open type process units 41 to 47. Also, an opening through which the wafer W is transferred by the main arm mechanism 21 is formed in each of these process units 41 to 47. Naturally, the opening is positioned to face the transfer zone 22. The wafer W transferred through the opening into the process unit is disposed on the wafer table 24.

The wafer W disposed on the wafer table 24 is heated in each of the hot plate units (HP) 41, 42, 43 and is cooled in each of the chilling plate units (CP) 44 and 45. On the other hand, the wafer W passes through the transfer/alignment unit (TR/ALIM) 46 when the wafer is transferred between the cassette station 10 and the process station 20. Also, the wafer position is adjusted relative to the process station 20 within the transfer/alignment unit (TR/ALIM) 46. Further, the wafer W is processed with an HMDS gas within the adhesion unit (AD) to make the wafer surface hydrophobic.

The fourth process group G4 also includes seven open type process units 48 to 54 which are stacked one upon the other as in the third process group G3. Specifically, the fourth process group G4 includes a transfer/chilling plate unit (TR/CP) 54, a chilling plate (CP) 53, and five hot plate units (HP) 52, 51, 50, 49 and 48, which are stacked one upon the other such that the unit (TR/CP) 54 occupies the lowermost position.

The fifth process group G5, which is arranged behind the main arm mechanism 21, also includes a plurality of open type process units which are stacked one upon the other as in the third and fourth process groups G3, G4, and is slidable in a Y-axis direction along a guide rail 67. If the fifth process group G5 is slid in the Y-axis direction, a sufficient free space is available behind the main arm mechanism 21 so as to facilitate the maintenance of the main arm mechanism 21.

The interface section 30 is equal to the process station 20 in its length in the X-axis direction. As shown in FIGS. 1 and 2, a movable pick-up cassette 31 and a stationary buffer cassette 32 are stacked one upon the other in a front portion of the interface section 30 such that cassette 31 occupies the upper position. Also, a peripheral light-exposure device 33 and a second sub-arm mechanism 34 are arranged in a back portion and central portion, respectively, of the interface section 30. The second sub-arm mechanism 34 is movable in an X-axis direction and a Z-axis direction so as to transfer the wafer W into the cassettes 31, 32 and into the peripheral light-exposure device 33. Further, the second sub-arm mechanism 34 is swingable by an angle θ about the Z-axis to permit transfer of the wafer W into the transfer/chilling plate unit (TR/CP) 54 included in the fourth process group G4 of the process station 20 and onto a wafer transfer table (not shown) on the side of the adjacent light-exposure device.

The resist processing system of the construction described above is arranged within an air-conditioned clean room. Further, a down flow of a clean air is formed within the resist processing system itself so as to further increase the cleanliness of the atmosphere within the system.

Figure 4:
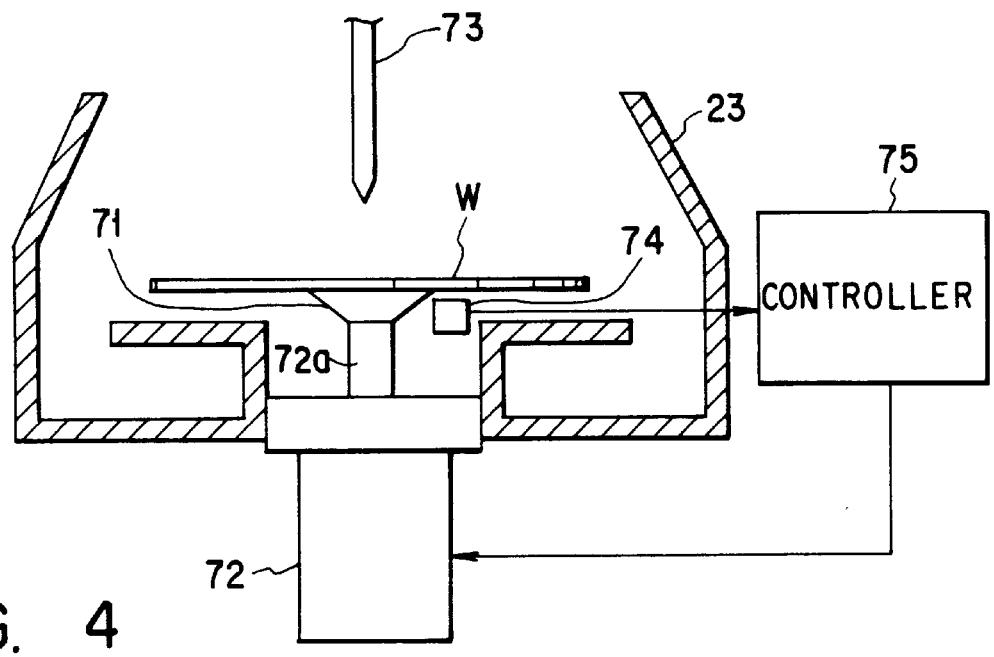
FIG. 4 is a cross sectional view showing a resist processing apparatus (resist coating unit)
Figure 5:
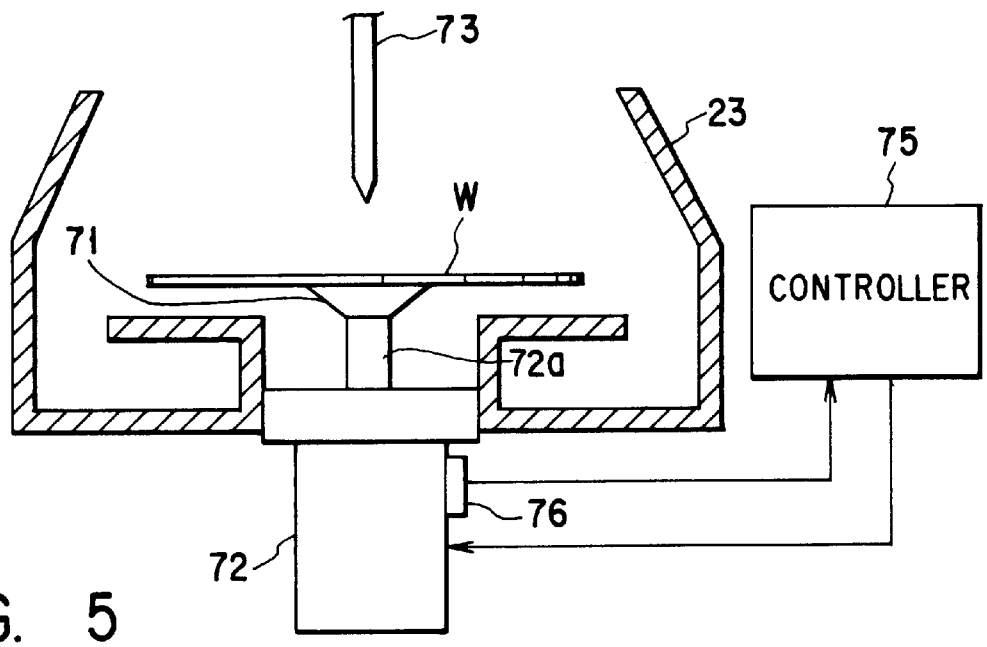
FIG. 5 is a cross sectional view showing another resist processing apparatus (resist coating unit)

Let us describe the spinner type process units (DEV) and (COT) with reference to FIGS. 4 and 5. These process units (DEV) and (COT) are included in each of the first and second process groups G1 and G2. Each of these process units (DEV) and (COT) comprises a drain cup 23, a spin chuck 71 and a nozzle 73. The drain cup 23 is formed to surround the outer circumferential portion and lower portion of the spin chuck 71. Also, a discharge passageway (not shown) is formed in a bottom portion of the drain cup 23. The nozzle 73 is arranged above the spin chuck 71 to permit a resist solution or developing solution to be supplied through the nozzle 73 to the wafer W disposed on the spin chuck 71. The spin chuck 71 is open in its upper surface to form a vacuum suction hole (not shown) such that the wafer W is held on the spin chuck 71 by vacuum suction. Further, a lower portion of the spin chuck 71 is joined to a driving shaft 72a of a motor 72.

In the spinner type process unit shown in FIG. 4, the number of rotations of the wafer is detected by a optical sensor 74 equipped with a light-emitting element and a light-receiving element. As shown in FIG. 11, an alignment mark 6 is put on an lower surface of the spin chuck 71 and detected by the optical sensor 74. A controller 75 counts the number of times of detection so as to detect the number of rotations of the wafer W. It should be noted that, when the wafer W is disposed on the spin chuck 71, the alignment mark 6 is positioned exactly on the optical axis of the optical sensor 74.

In the spinner type process unit shown in FIG. 5, the rotation angle, or the number of rotations, of the driving shaft of the motor 72 is detected by an encoder 76. Also, the optical sensor 74 and the encoder 76 are connected to the input terminal of the controller 75. Upon receipt of a detection signal generated from the optical sensor 74 or encoder 76, the controller 75 supplies a command signal to the power source circuit of the motor 72 so as to control the driving of the motor 72. To be more specific, the controller 75 supplies a command signal to the motor 72 based on the rotation detecting signal so as to permit the horizontal position of the orientation flat acting as a reference region of the wafer W taken out of the process unit to be equal to that in the step of transferring the wafer W into the process unit. It should be noted that, since the holder 26 of the main arm mechanism 21 is moved into and out of each of the spinner type process units (DEV) and (COT) in a predetermined direction, the wafer W can be positioned as desired easily. Incidentally, it is possible to use in combination the optical sensor 74 and the encoder 76 for detecting the rotation speed of the wafer W.

In washing the inner surface of the drain cup 23, a washing tool 84 having an alignment mark 84a put thereon as shown in FIG. 8 is mounted to the spin chuck 71. Further, a solvent such as a thinner is supplied from another nozzle (not shown) positioned below the nozzle 73 to the washing tool 84. The nozzle for supplying the solvent is disclosed in, for example, U.S. patent application Ser. No. 08/653,341 now U.S. Pat. No. 5,688,322. If the solvent is supplied from the solvent-supply nozzle to the washing tool 84, which is kept rotated about its own axis, the solvent is centrifugally scattered from the washing tool 84 toward the inner surface of the cup 23. It should be noted that the solvent-supply nozzle is positioned below the resist solution-supply nozzle 73 as already described. It follows that these two nozzles do not interfere with each other.

As shown in FIGS. 8 and 9, the washing tool 84 is housed in the chilling plate unit 44 included in the third process group G3. The inner space of the chilling plate unit 44 is partitioned by a rest 82 into a lower stage in which a chilling plate 81 is arranged and an upper stage in which a washing tool holder 83 is arranged. Pins P are used for moving the wafer W onto and away from the chilling plate 81.

The washing tool 84 is provided with a recess adapted to receive the washing tool holder 83 such that the holder 83 is engaged with the recess so as to hold the washing tool 84. The main arm mechanism 21 permits the washing tool 84 to be transferred between the chilling plate unit 44 and the resist coating unit (COT).

In washing the cup, the washing tool 84 is mounted to the spin chuck 71. After completion of the washing, operation of the spin chuck 71 is controlled by the controller 75 to permit the horizontal position of the alignment mark 84a of the washing tool 84 detached from the spin chuck 71 to be equal to the initial position in the step of mounting the washing tool 84 to the spin chuck 71, as in the case of transferring the wafer W into and out of the resist coating unit. It should be noted that the washing tool 84 is mounted outside the drain cup 23 of the resist coating unit. Naturally, the resist coating unit itself is not rendered bulky.

Figure 6:
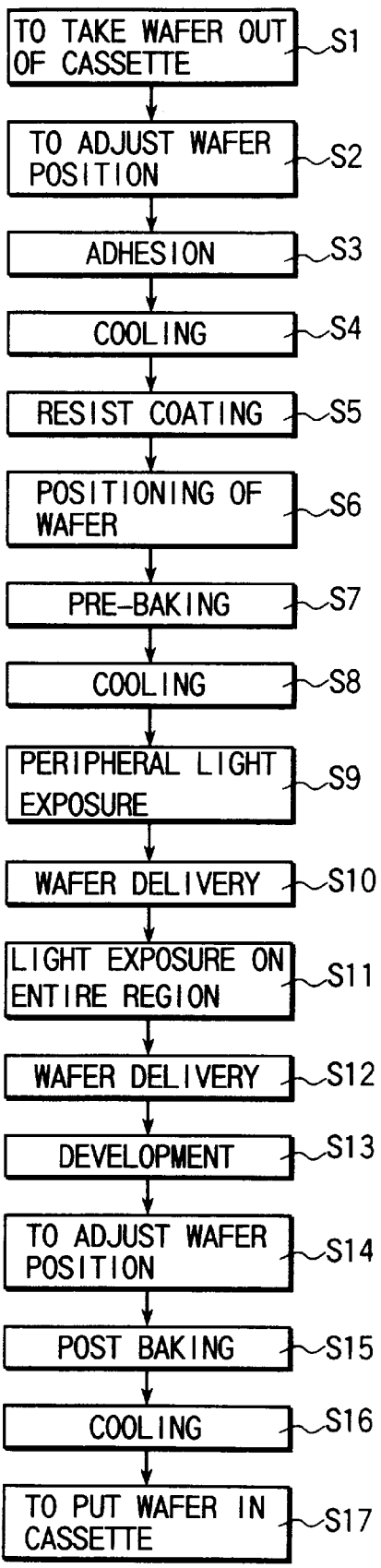
FIG. 6 is a flow chart showing a series of resist processing steps.
Figure 7:
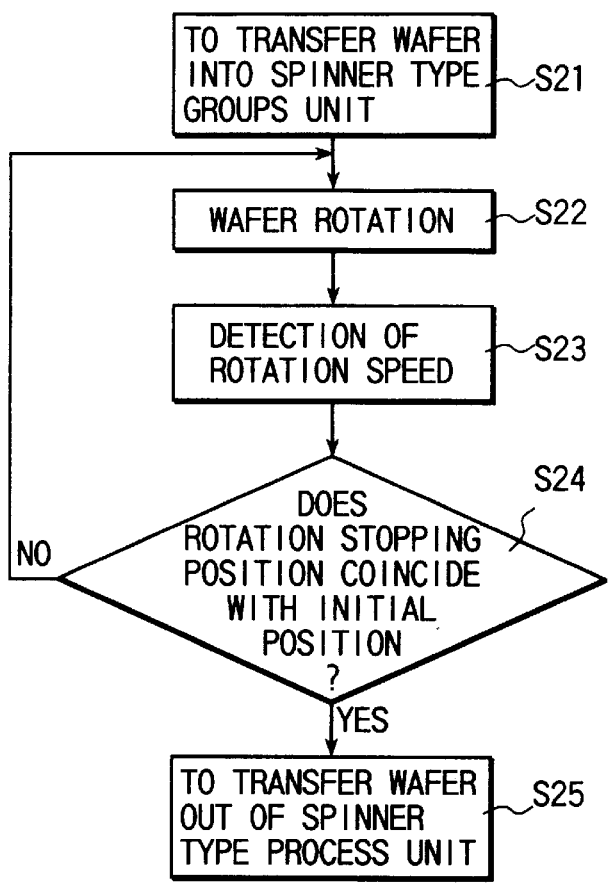
FIG. 7 is a flow chart showing the steps for adjusting the wafer position.

FIGS. 6 and 7 are flow charts each showing the steps of processing the wafer W. In the first step, the first sub-arm mechanism 4 is operated to take a single unprocessed wafer W having an orientation flat 7 out of the cassette 1 on the cassette table 2 (step S1). Then, the wafer W is transferred by the first sub-arm mechanism 4 into the transfer/alignment unit (TR/ALIM) 46 included in the third process group G3. Within the transfer/alignment unit (TR/ALIM) 47, the wafer W is centered, and the horizontal position of the orientation flat 7 of the wafer W is adjusted so as to position the wafer W as desired relative to the process station 20 (step S2).

In the next step, the main arm mechanism 21 takes the wafer W out of the transfer/alignment unit (TR/ALIM) 46 and, then, transfers the wafer W into the adhesion unit (AD) 47. In the adhesion unit (AD) 47, an adhesion treatment is applied to the wafer surface by supplying an HMDS gas while heating the wafer W (step S3). Further, the main arm mechanism 21 takes the wafer W out of the adhesion unit (AD) 47 and, then, transfers the wafer W into any one of the chilling plate units (CP) so as to cool the wafer W to about room temperature (step S4).

Then, the main arm mechanism 21 transfers the wafer W into the resist coating unit (COT) included in the first process group G1 so as to put the wafer W on the spin chuck 71. Under this condition, the spin chuck 71 is rotated at a predetermined speed, and a predetermined amount of a resist solution is supplied from the nozzle 73 onto the wafer W so as to coat the wafer surface with the resist (step S5). During the resist coating operation, the rotation speed of the wafer W is detected by the sensor 74 and/or the encoder 76.

After the resist solution ceases to be supplied from the nozzle 73, rotation of the spin chuck 71 is stopped so as to finish the resist coating operation. Then, the wafer W is positioned as desired within the resist coating unit (COT) (step S6).

FIG. 7 is a flow chart showing how the wafer W is positioned as desired within the resist coating unit (COT) in step S6 noted above. Specifically, the wafer W is transferred into the spinner type process unit (step S21). In this step, the initial position of the alignment mark 6 put to the spin chuck 71 is detected by the sensor 74, and the result of the detection is stored in the memory of the controller 75. Then, the wafer W is rotated together with the spin chuck 71 supporting the wafer W (step S22), and the number of rotations of the wafer W is detected by the sensor 74 and/or the encoder 76 (step S23). Based on the detected number of rotations of the wafer W, the controller 75 supplies a command signal to the motor 72 so as to stop rotation of the spin chuck 71.

Incidentally, it is impossible for the spin chuck 71 to stop its rotation simultaneously with transmission of a control signal from the controller 75 to the motor 72 because the inertia causes the spin chuck 71 to make an additional slight rotation. In the present invention, the actual position at which the spin chuck 71 stops its rotation is detected by the sensor 74 and/or the encoder 76. Then, the controller 75 reads out the initial position data from the memory and judges whether the actual stopping position of the spin chuck coincides with the initial position (step S24). Where the judgment indicates "NO", the steps S22 to S34 are repeated until the actual stopping position coincides with the initial position. To be more specific, the wafer W1 is rotated by an angle θ1 as shown in FIG. 12 to bring the orientation flat 7 back to the initial position. Where a notch 8 is formed in the wafer W2 as shown in FIG. 13, the wafer W2 is rotated by an angle θ1 as shown in FIG. 13 to bring the notch 8 back to the initial position. Where the judgment indicates "YES", the main arm mechanism 21 takes the wafer W out of the process unit (step S25).

In the next step, the main arm mechanism 21 transfers the wafer W into any one of the hot plate units (HP) for pre-baking the resist coating (step S7) and, then, into any one of the chilling plate units (CP) for cooling the wafer W (step S8). Further, the main arm mechanism 21 delivers the wafer W onto the second sub-arm mechanism 34 in the interface section 30. Then, the second sub-arm mechanism 34 transfers the wafer W into the peripheral light-exposure device 33 for selectively subjecting the peripheral region of the resist coating to a light-exposure treatment (step S9). Further, the second sub-arm mechanism 34 delivers the wafer W onto a third sub-arm mechanism (not shown) on the side of the light-exposure device (step S10). The wafer W is put by the third sub-arm mechanism on a wafer table (not shown) of the light-exposure device so as to subject the entire region of the resist coating to a light-exposure treatment (step S11).

The wafer W after the light-exposure treatment on the entire coating region is delivered from the third sub-arm mechanism (not shown) to the second sub-arm mechanism 34 (step S12). Then, the second sub-arm mechanism 34 transfers the wafer W into the transfer/chilling plate unit (TR/CP) 54 included in the fourth process group G4.

On the other hand, the main arm mechanism 21 gains access from the opposite side to the transfer/chilling plate unit (TR/CP) 54 so as to take the wafer W out of the unit (TR/CP) 54. Then, the main arm mechanism 21 transfers the wafer W into the developing unit (DEV) so as to develop the resist coating selectively exposed to light to form a pattern (step S13). After the developing treatment, the position of the wafer W is adjusted within the developing unit (DEV) (step S14). The positioning step S14 is substantially equal to the step S6 described previously. To reiterate, the steps S21 to S25 shown in FIG. 7 are repeated, as required.

Then, the main arm mechanism 21 transfers the wafer W into any one of the hot plate units (HP) for post-baking the wafer W (step S15) and, then, into any one of the chilling plate units (CP) for cooling the wafer to about room temperature (step S16). Further, the main arm mechanism 21 delivers the wafer W via the transfer/alignment unit (TR/ALIM) 46 onto the first sub-arm mechanism 4. Still further, the first sub-arm mechanism 4 puts the wafer W on a predetermined position within a predetermined cassette 1 (step S17) so as to finish a series of the resist processing.

In the embodiment described above, the wafer W is transferred into and out of each of the spinner type process units (DEV) and (COT) in the same horizontal position in respect of the orientation flat, making it unnecessary to transfer the wafer W into the transfer/alignment unit (TR/ALIM) 46 after the coating treatment and the developing treatment, leading to an improved through-put of the resist processing.

Figure 10:
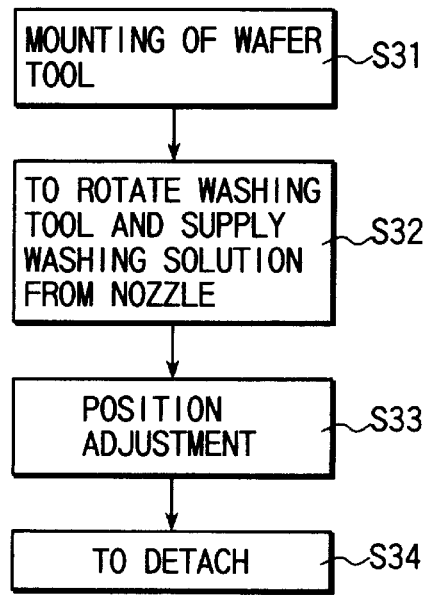
FIG. 10 is a flow chart showing the steps of washing a drain cup included in a resist coating unit.

FIGS. 8 to 10 collectively cover the case of washing the inner surface of the drain cup 23 of the resist coating unit (COT). In the first step, the main arm mechanism 21 takes the washing tool 84 out of the chilling plate unit 44 and, then, transfers the washing tool 84 into the resist coating unit (COT) so as to mount the washing tool 84 to the spin chuck 71 (step S31). Under this condition, the spin chuck 71 is rotated, and a thinner is supplied from a thinner supply nozzle (not shown) arranged separately from the resist solution supply nozzle 73 onto the washing tool 84 mounted to the spin chuck 71. As a result, the thinner is centrifugally separated from the washing tool 84 so as to collide against the inner surface of the cup 23 and, thus, to dissolve the resist attached to the inner surface of the cup 23. It follows that the resist is removed from the inner surface of the cup 23 so as to cleanse the cup 23.

After completion of the cup-washing operation, the washing tool 84 is positioned as desired, as in the case of coating the wafer W with resist (step S33). To be more specific, the steps S21 to S24 described previously are repeated in the positioning step S33 so as to permit the angular position of the washing tool 84 to be equal to the initial position in the step of transferring the washing tool 84 into the resist coating unit (COT). After the positioning step, the washing tool 84 is detached from the holder 83 by the main arm mechanism 21 (step S34).

Further, the main arm mechanism 21 transfers the washing tool 84 from the resist coating unit (COT) into the original storing place of the chilling plate unit 44. What should be noted is that the washing tool 84 is brought back to the chilling plate unit 44 in the angular position equal to that before use. It follows that the washing tool 84 need not be transferred into the transfer/alignment unit (TR/ALIM) 46 for adjusting the angular position thereof.

The present invention is not limited to the embodiments described above and can be modified in various fashions. For example, the embodiments described above cover the cases of a resist coating treatment and a developing treatment. However, the present invention can also be employed for other spinner type processing such as a washing-drying treatment.

Also, the above-described embodiments cover the cases of processing a semiconductor wafer having an orientation flat as a reference region. However, a semiconductor wafer having a notch can also be processed in the present invention. Further, it is possible to process in the present invention substrates other than semiconductor wafers. For example, it is possible to process LCD substrates, glass substrates, photo masks, and printed circuit boards.

As described above, rotation of a spin chuck holding a substrate is controlled in the present invention to permit the horizontal position of a reference region of the substrate taken out of a spinner type process unit to be equal to that in the step of transferring the substrate into the spinner type process unit, making it unnecessary to adjust the horizontal position of the substrate taken out of the spinner type process unit before transfer of the substrate into a subsequent process unit. Also, in the case of washing a drain cup included in a resist coating unit, the angular position of the washing tool taken out of the resist coating unit after completion of the washing operation can be made equal to that in the step of transferring the washing tool into the resist coating unit. As a result, the angular position of the washing tool need not be adjusted in the next cup-washing step, making it possible to mount easily the washing tool to the holder in the next cup-washing step.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A resist processing method in which a substrate is successively transferred by an arm mechanism into a plurality of process units for successively processing the substrate, comprising the steps of:
   (a) loading a substrate having a reference region which is aligned as desired relative to the process unit and the arm mechanism in a horizontal plane, into said process unit, said substrate being held substantially horizontal by a spin chuck surrounded by a drain cup;
   (b) rotating said spin chuck holding the substrate and supplying a process solution onto the substrate rotated together with the spin chuck;
   (c) stopping the supply of said process solution and also stopping rotation of the substrate;
   (d) detecting a position of said reference region in the horizontal plane of the substrate held on the spin chuck;
   (e) rotating the substrate together with the spin chuck based on the position detected in said step (d) to permit the reference region of the substrate to be aligned with an initial position in the step (a) of loading the substrate into the process unit; and
   (f) unloading the substrate out of the process unit when the substrate is rotated to a position at which the reference region of the substrate is aligned with said initial position.

2. The method according to claim 1, wherein at least one of the number of rotations and angular position of said substrate is sequentially detected during said steps (b) to (d).

3. The method according to claim 1, wherein said substrate is coated with a resist solution in said step (b).

4. The method according to claim 1, wherein a developing solution is supplied to said resist coating on the substrate in said step (b).

5. The method according to claim 1, wherein said substrate is a semiconductor wafer having an orientation flat as said reference region.

6. The method according to claim 1, wherein said substrate is a semiconductor wafer having a notch as said reference region.

7. The method according to claim 1, which further comprises after said step (f) additional steps of:

(g) mounting a washing tool having a reference region which is aligned as desired relative to the process unit and the arm mechanism in the horizontal plane, onto said spin chuck;

(h) rotating said washing tool together with the spin chuck and supplying a solvent to the rotating washing tool to permit said solvent to be centrifugally separated from the washing tool and to strike an inner surface of the drain cup, thereby dissolving an object adhered to said inner wall in said solvent so as to remove the adhered object;

(i) stopping supply of said solvent and also stopping rotation of the washing tool;

(j) detecting a position of said reference region of the stopped washing tool held on the spin chuck;

(k) rotating the washing tool together with the spin chuck to permit the reference region of the washing tool to be aligned to an initial position in the step (g); and (l) transferring the washing tool out of the process unit when the reference region of the washing tool is made aligned with said initial position.

8. A resist processing apparatus, comprising:

a process chamber;

a spin chuck having a reference region, and for holding a substrate having a reference region within said process chamber;

rotating means for rotating said spin chuck;

a nozzle for supplying a process solution onto the substrate held on the spin chuck;

a drain cup surrounding said spin chuck and the substrate;

an arm mechanism for loading the substrate into the process chamber at a constant direction and for unloading the substrate out of the process chamber at the constant direction; and control means for controlling the operation of said rotating means to permit said reference region of the substrate taken out of the process chamber to be aligned with that in the step of loading the substrate into the process chamber.

9. The apparatus according to claim 8, further comprising detecting means for detecting a position of the reference region of the substrate or spin chuck which has ceased to rotate, said detecting means supplying an electric signal denoting the detected position to said control means to control operation of the rotating means.

10. A resist processing apparatus, comprising:

a process chamber;

a spin chuck having a reference region, and for holding a substrate within said process chamber;

rotating means for rotating said spin chuck;

a drain cup surrounding the spin chuck;

a washing tool held on the spin chuck;

an arm mechanism for loading the substrate or the washing tool into the process chamber at a constant direction and for unloading the substrate or the washing tool out of the process chamber at the constant direction;

a first nozzle for supplying a resist solution onto the substrate held on the spin chuck;

a second nozzle for supplying a solvent to the washing tool held on the spin chuck;

detecting means for detecting a position of the reference region of the washing tool or spin chuck; and control means for controlling the operation of said rotating means based on the horizontal position detected by said detecting means to permit the reference region of the washing tool taken out of the process chamber to be aligned with that in the step of loading the washing tool into the process chamber.

11. The apparatus according to claim 10, wherein said washing tool is arranged outside of said process chamber, and transferred into the process chamber by said arm mechanism.

12. The apparatus according to claim 10, wherein said first nozzle supplies a resist solution from above the holding surface of the spin chuck, and said second nozzle supplies a solvent from below the holding surface of the spin chuck.

* * * * *